(12) United States Patent
Koshikawa (10) Patent No.: US 6,414,887 B2
(45) Date of Patent: Jul. 2, 2002

(54) SEMICONDUCTOR MEMORY DEVICE (75) Inventor: Yasuji Koshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/846,252

(22) Filed: May 2, 2001

Related U.S. Application Data (62) Division of application No. 09/545,884, filed on Apr. 7, 2000, now Pat. No. 6,272,057.

(30) Foreign Application Priority Data

Apr. 7, 1999 (JP) ............................................ 11-100623

(51) Int. Cl.⁷ ................................................. G11C 7/00
(52) U.S. Cl. ........................ 365/200; 365/203; 365/204; 365/230.06; 365/230.01
(58) Field of Search ........................ 365/189.01, 203.01, 365/203, 204, 200, 230.06

(56) References Cited

U.S. PATENT DOCUMENTS

| | | | |
|---|---|---|---|
| 5,355,339 A | 10/1994 | Oh et al. | 365/200 |
| 5,652,725 A | 7/1997 | Suma et al. | 365/200 |
| 5,699,306 A | 12/1997 | Lee et al. | 365/200 |
| 5,732,031 A * | 3/1998 | Morgan | 365/200 |
| 5,907,514 A * | 5/1999 | Lee et al. | 365/200 |
| 5,933,382 A * | 8/1999 | Yi et al. | 365/225.7 |
| 5,959,906 A | 9/1999 | Song et al. | 365/200 |
| 5,970,001 A * | 10/1999 | Noda et al. | 365/200 |
| 6,078,534 A | 6/2000 | Pfefferl et al. | 365/200 |

FOREIGN PATENT DOCUMENTS

JP          10-83694        3/1998

OTHER PUBLICATIONS

Japanese Office Action dated Feb. 5, 2002, with partial translation.

* cited by examiner

Primary Examiner—Viet Q. Nguyen
(74) Attorney, Agent, or Firm—McGinn & Gibb, PLLC (57) ABSTRACT A semiconductor memory device is designed to speed up the selection of a word line. The semiconductor memory device comprises a plurality of normal row decoders for decoding input row address data for specifying word lines when access is made to those of memory cells of a memory cell array which are other than a redundant row of memory cells, thereby selecting those word lines to which those memory cells that are other than the redundant row of memory cells are connected; a redundant row decoder for specifying that word line to which the redundant row of memory cells is connected when access is made to any memory cell which belongs to the redundant row; decision means for determining whether or not to select a memory cell belonging to the redundant row based on the input row address data and selecting the redundant row decoder when selecting the memory cell belonging to the redundant row; and control means for changing only those word lines which are connected to the normal row decoders from an active state to a standby state based on a decision output of the decision means when the decision means has determined to select a memory cell belonging to the redundant row when changing the word lines connected to the normal row decoders from a standby state to an active state.

4 Claims, 8 Drawing Sheets

(A) CLK (B) COMMANDS (/RAS, /CAS, /WE, /CS)

(C) ADD (D) REDUNDANCY DECISION SIGNAL (E) OUTPUT OF AND GATE 30

(F) OUTPUT OF AND GATE 28

(G) PRECHARGE SIGNAL (H) NORMAL MAIN WORD LINE 50-1

(I) NORMAL SUB WORD LINE (60-1, 60-2,...)

(J) REDUNDANT MAIN WORD LINE 80

(K) REDUNDANT SUB WORD LINE (70-1)

(L) READ/WRITE DATA DQ

SEMICONDUCTOR MEMORY DEVICE

This Application is a divisional of application Ser. No. 09/545,884, filed Apr. 7, 2000, now U.S. Pat. No. 6,272,057.

BACKGROUND OF THE INVENTION

1. Field of the Invention

The present invention relates to a semiconductor memory device such as DRAM, and, more particularly, to memory access control for a semiconductor memory device having a memory cell array including a redundant row. This application is based on Japanese Patent Application No. Hei 11-100623, the contents of which are incorporated herein by reference.

2. Description of Related Art Including Information Disclosed Under 37 CFR 1.97 and 37 CFR 1.98

A row decoder which selects a word line in a semiconductor memory device such as DRAM is typically constructed by a dynamic circuit because it has fewer elements than a static circuit and must switch word lines from one to another through a precharge period (where an external clock /RAS has a high level) in order to prevent information in the memory cells from being destroyed.

The "static circuit" here means the circuit structure that has a single PMOS transistor and NMOS transistor per single input of a plurality of row address predecode signal inputs and can set the input terminal of a buffer which activates or deactivates the associated word line to a high level or low level based on the associated predecode signal.

The "dynamic circuit" means the circuit structure that can set the input terminal of a buffer to a high level or low level by using means for precharging the input terminal of the buffer and means for discharging the input terminal in accordance with a plurality of row address predecode signal inputs. The logic level of the output of the static circuit is determined in accordance with the logic level of the input. By way of contrast, the logic level of the output of the dynamic circuit is determined in accordance with the logic level of the input immediately after precharging, but does not change according to the logic level of the input immediately once the circuit is discharged.

Figure 9:
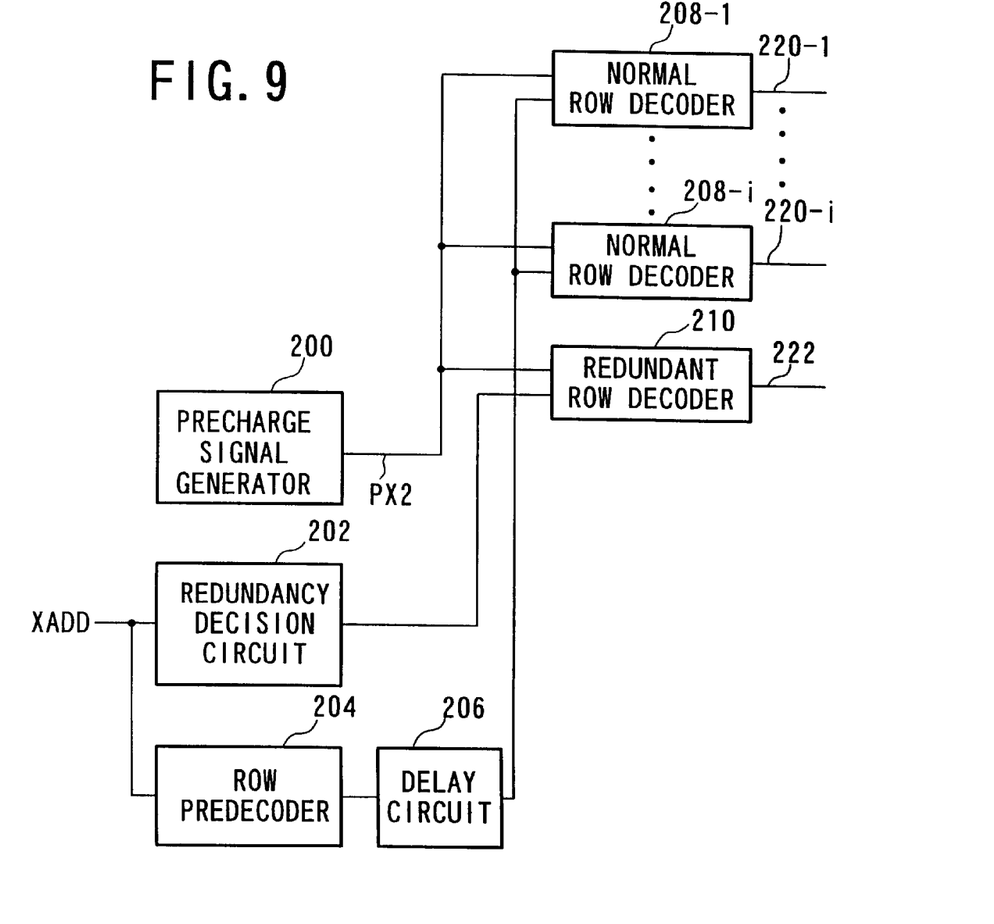
FIG. 9 is a block diagram illustrating the structure of the essential portion of a conventional semiconductor memory device.

FIG. 9 shows the structure of the essential portion of a conventional semiconductor memory device of this type that is associated with word-line selection.

Referring to this figure, the semiconductor memory device comprises a precharge signal generator 200 which generates a precharge signal (PX2) for precharging a word line, a redundancy decision circuit 202 which determines whether or not to select a memory cell belonging to a redundant row, a row predecoder 204 which outputs address data for selecting one of normal row decoders 208-1 to 208-i based on an row address (XADD), a delay circuit 206 which delays the output of the row predecoder 204 by a predetermined time, and a redundant row decoder 210. The normal row decoders 208-1 to 208-i and redundant row decoder 210 are constructed by a dynamic circuit.

The output terminals of the normal row decoders 208-1 to 208-i are respectively connected to word lines 220-1 to 220-i, and the output terminal of the redundant row decoder 210 is connected to a word line 222. The operation of the thus constituted semiconductor memory device will be discussed with reference to FIG. 10. First, with every row address data or input address signal (XADD) set to a low level (non-selected state), the precharge signal PX2 of a low level is supplied to the individual normal row decoders 208-1 to 208-i and the redundant row decoder 210 until time t20, thereby precharging (rendering in a standby state) the output nodes of all the decoders or the word lines 220-1 to 220-i and 222 ((A) in FIG. 10). Even if the precharge signal PX2 becomes a high level at time t20, this low-voltage level is retained in each decoder.

Figure 10:
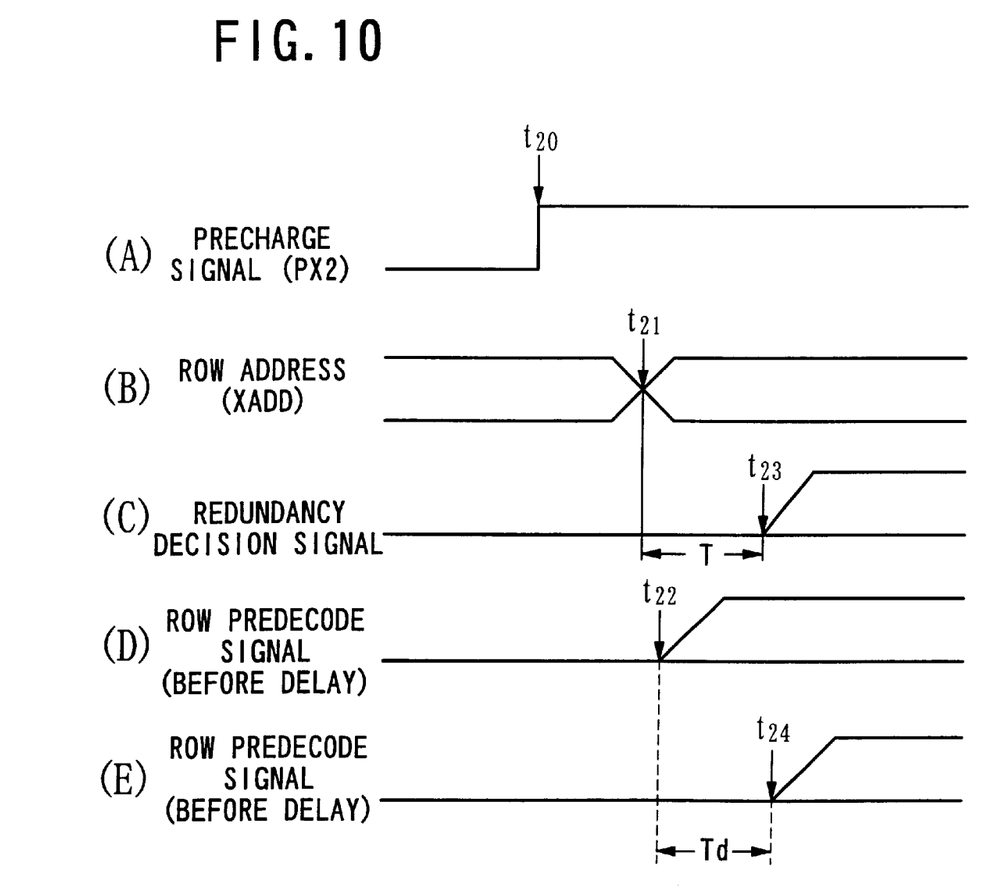
FIG. 10 is a timing chart for explaining the operation of the semiconductor memory device shown in FIG. 9.

When the row address is settled at time t21 ((B) in FIG. 10), the row predecoder 204 outputs a row predecode signal at time t22 ((D) in FIG. 10). This row predecode signal is delayed by a predetermined time Td in the delay circuit 206 and is input to the individual normal row decoders 208-1 to 208-i at time t24 ((E) in FIG. 10). In FIG. 10, "T" is the time needed for the redundancy decision circuit 202 to output a decision signal at time t23 from time t21 at which the row address has been settled.

The delay time Td of the delay circuit 206 in the conventional semiconductor memory device is set in such a way as to provide a sufficient time from the point of time when the redundancy decision circuit 202 has made a decision on as to whether or not to select a redundant row in the unillustrated memory cell array, i.e., time t23 at which the redundancy decision circuit 202 has output the redundancy decision signal, to time t24 at which the delay circuit 206 outputs the row predecode signal. Because of the use of a dynamic circuit for a row decoder, this row decoder is advantageous from the view point of the space as compared with a row decoder using a static circuit, but it cannot reset a word line once the word line is selected, i.e., the word line cannot be set back to a non-selected state. This therefore requires that the row predecode signal should be made to rise after the decision result of the redundancy decision circuit is output or the row predecode signal should be input to the target normal row decoder.

As the conventional semiconductor memory device is designed so as to raise the row predecode signal to select a normal row decoder after the decision result of the redundancy decision circuit is output, selection of a word line is delayed so that it takes time to read and output stored data.

BRIEF SUMMARY OF THE INVENTION

Accordingly, it is an object of the present invention to provide a semiconductor memory device which is designed to speed up selection of a word line.

To achieve the above object, according to the first aspect of this invention, there is provided a semiconductor memory device having a memory cell array having a plurality of memory cells connected to respective word lines and data lines and having a redundant row of memory cells, for accessing any of the memory cells by changing an associated word line and associated data line from a standby state to an active state, which semiconductor memory device comprises a plurality of normal row decoders for decoding input row address data for specifying word lines when access is made to those of the memory cells which are other than the redundant row of memory cells, thereby selecting those word lines to which those memory cells that are other than the redundant row of memory cells are connected; a redundant row decoder for specifying that word line to which the redundant row of memory cells is connected when access is made to any memory cell which belongs to the redundant row; decision means for determining whether or not to select a memory cell belonging to the redundant row based on the input row address data and selecting the redundant row decoder at a time of selecting the memory cell belonging to the redundant row; and control means for changing only those word lines which are connected to the normal row decoders from an active state to a standby state based on a decision output of the decision means when the decision means has determined to select a memory cell belonging to the redundant row at a time of changing the word lines connected to the normal row decoders from a standby state to an active state.

According to the second aspect of this invention, there is provided a semiconductor memory device having a memory cell array having a plurality of memory cells connected to respective word lines and data lines and having a redundant row of memory cells, for accessing any of the memory cells by changing an associated word line and associated data line from a standby state to an active state, which semiconductor memory device comprises a plurality of normal row decoders for decoding input row address data for specifying word lines when access is made to those of the memory cells which are other than the redundant row of memory cells, thereby selecting those word lines to which those memory cells that are other than the redundant row of memory cells are connected; a redundant row decoder for specifying that word line to which the redundant row of memory cells is connected when access is made to any memory cell which belongs to the redundant row; decision means for determining whether or not to select a memory cell belonging to the redundant row based on the input row address data and selecting the redundant row decoder at a time of selecting the memory cell belonging to the redundant row; first control means for rendering those word lines which are connected to the normal row decoders to a standby state or an active state, generating a first control signal for changing only the word lines connected to the normal row decoders from the active state to the standby state when the decision means has determined to select a memory cell belonging to the redundant row and a second control signal for changing the word lines connected to the redundant row decoder to the standby state or the active state, and supplying the first control signal to the normal row decoders and the second control signal to the redundant row decoder; and second control means for selecting one of the plurality of normal row decoders based on the input row address data and rendering the normal row decoders to a non-selected state when the decision means has determined to select a memory cell belonging to the redundant row.

The semiconductor memory device according to the second aspect of this invention may comprise third control means, instead of the first control means, for supplying the normal row decoders and the redundant row decoder with a third control signal for rendering those word lines which are connected to the normal row decoders and the redundant row decoder to a standby state or an active state, and supplying the normal row decoders with a fourth control signal for changing only the word lines connected to the normal row decoders from the active state to the standby state when the decision means has determined to select a memory cell belonging to the redundant row.

With the structures according to the first and second aspects of this invention and the modification of the second aspect, the control means changes only those word lines which are connected to the normal row decoders from the active state to the standby state based on the decision output of the decision means when the decision means has determined to select a memory cell belonging to the redundant row at the time of changing the word lines connected to the normal row decoders from the standby state to the active state. This can allow a target normal row decoder to be selected without waiting for the decision being made on whether or not to select a memory cell belonging to the redundant row. It is therefore possible to quickly select the word line that is connected to the target normal row decoder.

According to the third aspect of this invention, there is provided a semiconductor memory device comprising a node to be precharged to a predetermined level; normal row decoding means for discharging the node to select one of normal word lines when predetermined address data is input; and precharge means for precharging the node again when one of redundant word lines is selected.

In the semiconductor memory device according to the third aspect of the invention, the precharge means may have one precharge transistor which is enabled to set the node to a precharge potential when a precharge command (PC) is externally input or one of the redundant word lines is selected. In this case, the precharge means may have first and second precharge transistors such that the first precharge transistor is enabled to set the node to the precharge potential when the precharge command (PC) is externally input and the second precharge transistor is enabled to set the node to the precharge potential when one of the redundant word lines is selected.

According to the fourth aspect of this invention, there is provided a semiconductor memory device comprising normal row decoding means for activating a predetermined one of the normal word lines when predetermined address data is input; redundancy decision means for outputting a decision signal for selecting a predetermined one of the redundant word lines when the address data is input; and means for deactivating the activated normal word line based on the decision signal.

In the semiconductor memory device according to the fourth aspect of this invention, the redundancy decision means may output redundancy decision signals corresponding to a plurality of redundant word lines to a redundant row decoder; and the decision signal may be enabled when one of the redundancy decision signals is enabled.

In any of the semiconductor memory devices according to the third and fourth aspect of this invention and their modifications, sub word drivers may be respectively connected to the normal word lines and redundant word lines.

With the structures according to the third aspect of this invention and the modifications thereof, it is possible to select a target normal row decoder without waiting for the decision being made on whether or not to select a memory cell belonging to the redundant row. This can ensure fast selection of the word line that is connected to the target normal row decoder.

With the structures according to the fourth aspect of this invention and its modifications, even if selection of a normal word line is temporarily attempted, when a redundant word line is selected, the normal word line can be deactivated, so that no problem arises in the operation of selecting a word line.

DETAILED DESCRIPTION OF THE INVENTION

Figure 1:
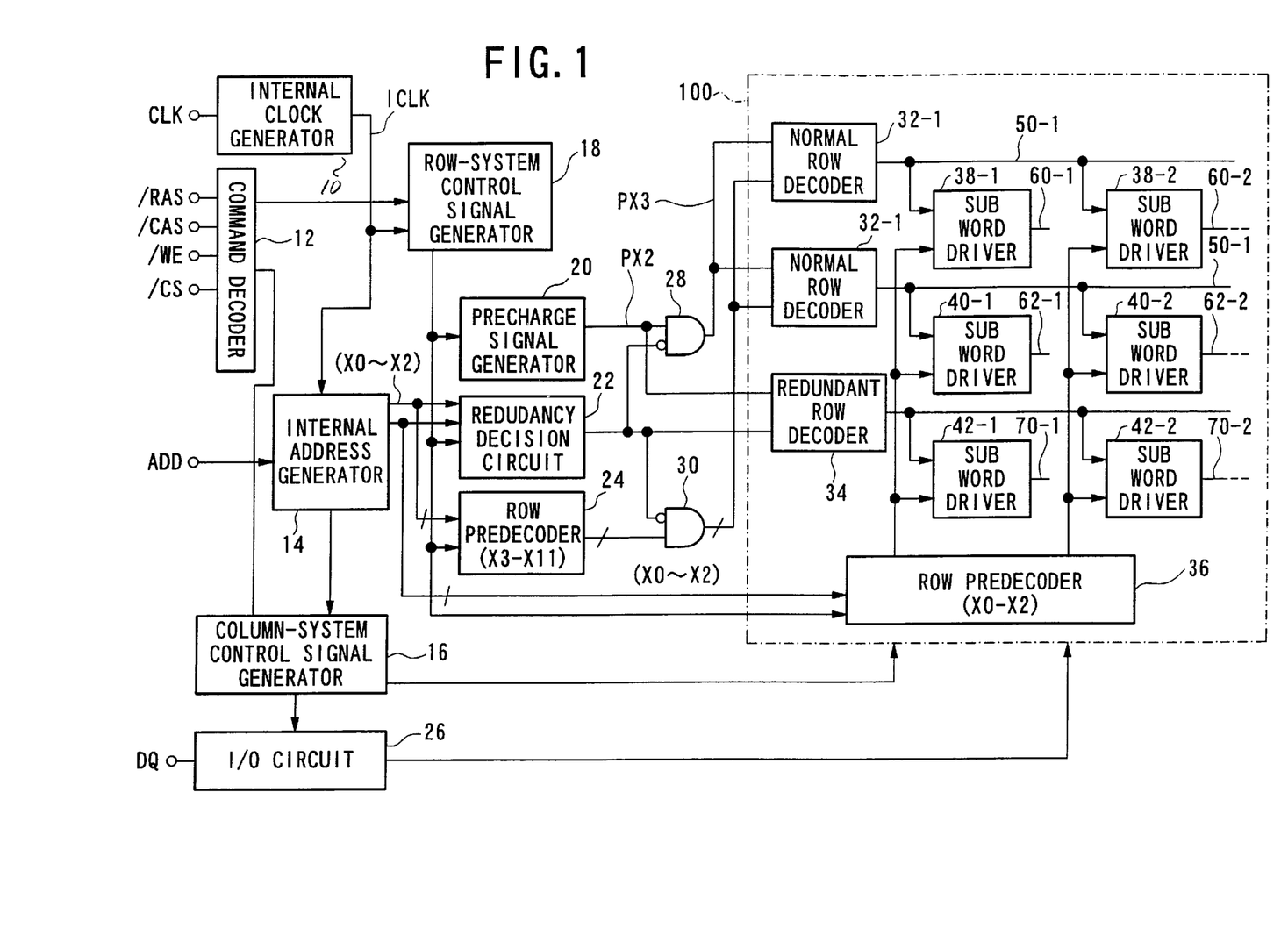
FIG. 1 is a block diagram illustrating the structure of the essential portion of a semiconductor memory device according to a first embodiment of the present invention.

Preferred embodiments of the present invention will now be described with reference to the accompanying drawings. FIG. 1 shows the structure of the essential portion of a semiconductor memory device according to the first embodiment of this invention. Referring to this figure, the semiconductor memory device comprises an internal clock generator 10 which receives a reference clock CLK and generates an internal clock ICLK, a command decoder 12, an internal address generator 14, a column-system control signal generator 16, a row-system control signal generator 18, a precharge signal (PX2) generator 20, a redundancy decision circuit 22, a row predecoder 24, an input/output (I/O) circuit 26 which receives and outputs data DQ, AND gates 28 and 30, and a memory cell array 100.

The memory cell array 100 has normal row decoders 32-1 to 32-i, a redundant row decoder 34, sub word drivers 38-1, 38-2, ..., 40-1, 40-2, ..., and 42-1, 42-2, ..., and a row predecoder 36 (X0 to X2). The memory cell array 100 further has a plurality of memory cells connected to associated sub word lines and data lines.

The command decoder 12 fetches various synchronous clocks /RAS, /CAS, /WE and /CS and generates various commands (e.g., an active command, read command, write command, and precharge command) and sends them to the associated sections. The active command is equivalent to the synchronous clock /RAS (Row Address Strobe).

The /RAS signal specifies the timing at which row address data (X0 to X11) is to be fetched, and "/" indicates that this signal is enabled at a low level. The /CAS (Column Address Strobe) specifies the timing at which column address data is to be fetched, and "/" likewise indicates that this signal is enabled at a low level.

The internal address generator 14 fetches the row address data and column address data included in an address signal ADD, externally input to its address terminal, at rising of the /RAS signal and /CAS signal, respectively, and sends those address data to a row decoder and a column decoder (not shown), respectively. In FIG. 1, the portion associated with the row address alone is illustrated. In this embodiment, row address data is sent to the redundancy decision circuit 22 and the row predecoders 24 and 36. The row address data in this embodiment consists of 12 bits or signals X0 to X11, each consisting of one bit, which are generically denoted by "XADD". The lower 3 bits X0 to X2 of the row address data are sent to the row predecoder 36 which respectively sends decoded signals to the eight columns of sub word drivers 38-1, ..., 40-1, ..., and 42-1, ....

Based on the synchronous clock /RAS and the internal clock ICLK, the row-system control signal generator 18 outputs control signals for controlling the operation timings of the precharge signal generator 20, the redundancy decision circuit 22, and the row predecoders 24 and 36. Based on the outputs of the command decoder 12 and the internal address generator 14, the column-system control signal generator 16 outputs control signals for controlling the operation timings of the I/O circuit 26 and the circuits that are associated with the row decoder.

The precharge signal generator 20 generates a precharge signal (PX2) for rendering word lines from a standby state (precharge state) to an active state in which data is writable into and readable from memory cells. The precharge signal PX2, the output of the precharge signal generator 20, is supplied via the AND gate 28 to the individual normal row decoders 32-1 to 32-i as a signal PX3, and is directly supplied to the redundant row decoder 34. The output signal of the row predecoder 24 or address data is supplied to the individual normal row decoders 32-1 to 32-i.

The row predecoder 24 has three decoders which respectively decode row address data X3 to X5, X6 to X8 and X9 to X11, and each decoder outputs eight predecode signals. Hereinafter, the signals obtained by decoding the row address data X3 to X5, X6 to X8, and X9 to X11 are respectively called first, second, and third predecode signals. While FIG. 1 shows a single signal line for the predecode signals, there are actually 24 signal lines. Likewise, there are 24 AND gates 30.

Each of the normal row decoders 32-1 to 32-i receives a total of three predecode signals, one from each of the first, second, and third predecode signals. When nine pieces of row address data are input to the row predecoder 24, there are 512 normal row decoders (32-1 to 32-i).

The redundancy decision circuit 22 compares a value set in a fuse circuit the row address data (XADD: X0–X11) input from the internal address generator 14 to determine whether or not to select a memory cell belonging to the redundant row, and selects the redundant row decoder 34 when such a memory cell selection is made. The decision output of the redundancy decision circuit 22 is supplied to the redundant row decoder 34 and also to the AND gates 28 and 30 as a gate signal. Although the redundancy decision circuit 22 is connected to one redundant row decoder 34 in FIG. 1, there may be a plurality of redundant row decoders as shown in FIG. 8.

Figure 8:
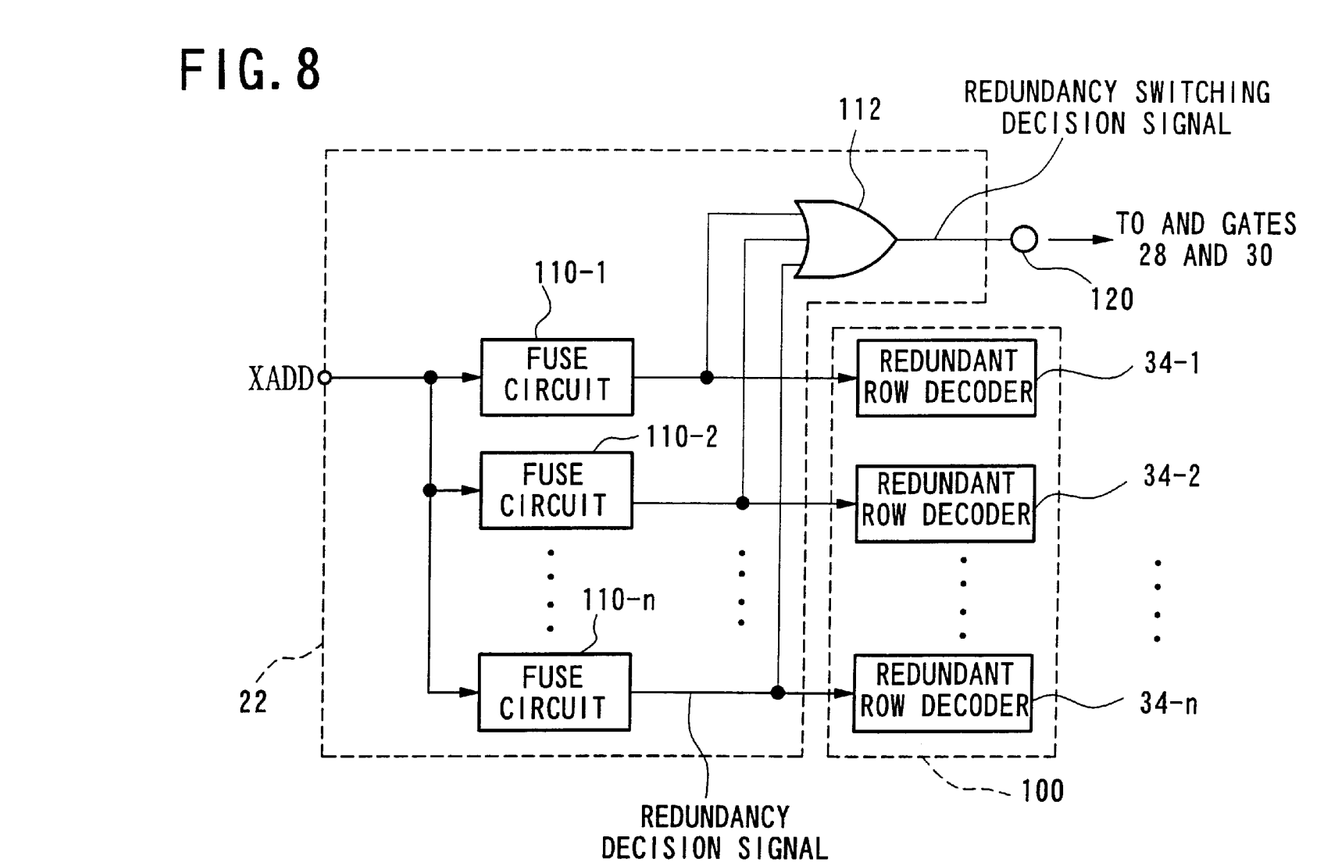
FIG. 8 is a block diagram illustrating a modification of this invention.

In FIG. 8, the memory cell array 100 is provided with a plurality of redundant row decoders 34-1 to 34-n and the redundancy decision circuit 22 has a plurality of fuse circuits 110-1 to 110-n associated with those redundant row decoders 34-1 to 34-n and an OR gate 112 which performs a logical sum of individual redundancy decision signals from the fuse circuits 110-1 to 110-n. In this structure, match decision outputs (redundancy decision signals) output from the fuse circuits 110-1 to 110-n are supplied to the associated redundant row decoders 34-1 to 34-n. The match decision outputs output from the fuse circuits 110-1 to 110-n are ORed by the OR gate 112. When one of the match decision outputs output from the fuse circuits 110-1 to 110-n is enabled, therefore, the OR gate 112 outputs an enabled decision output. This enabled decision output (redundancy switching decision signal) is output from an output terminal 120 and supplied to the AND gates 28 and 30 in FIG. 1. The redundancy decision circuit 22 is equivalent to the decision means of this invention.

The precharge signal generator 20 and the AND gates 28 and 30 are equivalent to the control means that changes only those word lines which are connected to the normal row decoders from the active state to the standby state based on the decision output of the redundancy decision circuit 22 when the redundancy decision circuit 22 has determined to select a memory cell belonging to the redundant row at the time the word lines connected to the normal row decoders have been changed from the standby state to the active state.

The precharge signal generator 20 and the AND gate 28 are equivalent to the first control means of this invention and the precharge signal generator 20 and the AND gate 30 are equivalent to the second control means of this invention.

Normal main word lines 50-1 to 50-1 are respectively connected to the output terminals of the normal row decoders 32-1 to 32-i, and a redundant main word line 80 is connected to the output terminal of the redundant row decoder 34. It is to be noted that there may be a plurality of redundant row decoders 34.

When access is made to those of the memory cells in the memory cell array 100 which are other than the redundant row of memory cells, the normal row decoders 32-1 to 32-i decode the first to third predecode signals that are input then, and select the word lines to which the other memory cells than the redundant row of memory cells are connected, i.e., the normal main word lines 50-1 to 50-1.

When access is made to that one of the memory cells which belongs to the redundant row, the redundant row decoder 34 selects the word line to which the redundant row is connected, i.e., the redundant main word line 80.

In this embodiment, the word lines take a hierarchical structure so that the normal main word lines 50-1 to 50-1 are separated into sub word lines 60-1, 60-2, . . . , 62-1, 62-2, . . . , and the redundant main word line 80 is separated into sub word lines 70-1, 70-2, . . .

The row predecoder 36 outputs a decode signal for selecting one of eight columns of sub word drivers 38-1 to 70-2, . . . based on the row address data X0–X2.

Figure 2:
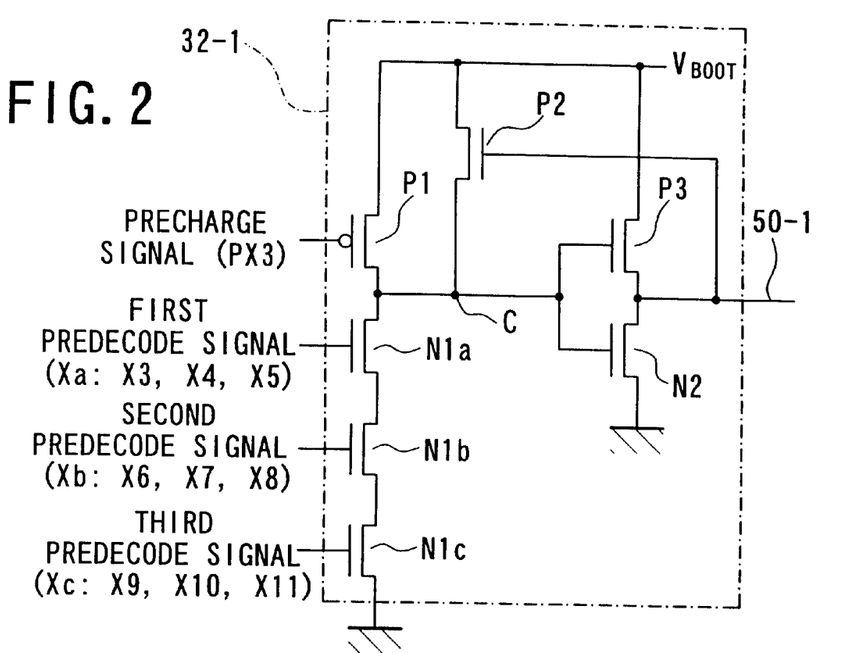
FIG. 2 is a circuit diagram showing the specific structure of a normal row decoder in FIG. 1.

FIG. 2 shows the specific structure of each of the normal row decoders 32-1 to 32-i. Because those normal row decoders have the same structure, FIG. 2 shows the structure of only the normal row decoder 32-1. Referring to this diagram, the normal row decoder 32-1 comprises PMOS transistors P1, P2, and P3 and NMOS transistors N1$a$, N1$b$, N1$c$, and N2. The PMOS transistor P1 has a source connected to a boosting voltage supply $V_{BOOT}$ and a drain connected to the drain of the NMOS transistor N1$a$ or a node C. The NMOS transistors N1$a$, N1$b$ and, N1$c$ are connected in series with the source of the NMOS transistor N1$c$ grounded.

It is assumed that the normal row decoder 32 and the redundant row decoder 34 operate on a boosted voltage $V_{BOOT}$ (1.5 to 2 times the supply voltage VDD) and the AND gates 28 and 30 and the row predecoder 36 have circuits for converting the level of the supply voltage VDD to the level of the boosted voltage $V_{BOOT}$.

The drain of the NMOS transistor N1a is connected to the gate (node C) of the PMOS transistor P3 whose source is connected to the boosting voltage supply $V_{BOOT}$.

The drain of the PMOS transistor P3 is connected to the drain of the NMOS transistor N2 and to the normal main word line 50-1. The NMOS transistor N2 has a source grounded and a gate (node C) connected to the gate of the PMOS transistor P3, so that the PMOS transistor P3 and the NMOS transistor N2 constitute a CMOS inverter.

The output signal of the precharge signal generator 20 is supplied via the AND gate 28 to the gate of the PMOS transistor P1, and the first to third decode outputs of the row predecoder 24 are respectively supplied via the AND gate 30 to the gates of the NMOS transistors N1a to N1c. The output terminal of the CMOS inverter or the node between the drain of the PMOS transistor P3 and the drain of the NMOS transistor N2 is connected to the normal main word line 50-1. The PMOS transistor P2 serves to prevent the node C from floating, and has a source connected to the boosting voltage supply $V_{BOOT}$, a drain connected to the gate (node C) of the PMOS transistor P3, and a gate connected to the drain of the PMOS transistor P3.

The operation of the normal row decoder 32-1 shown in FIG. 2 will be discussed below.

(When the word line 50-1 is selected)

While the precharge signal PX3 is at a low level, the PMOS transistor P1 is enabled so that the potential at the node C is precharged to $V_{BOOT}$ (high level) and the normal main word line 50-1 becomes a low level. At this time, the PMOS transistor P2 is enabled so that it works to keep the potential at the node C at $V_{BOOT}$.

When the row address data X0–X11 are externally input, the precharge signal PX3 becomes a high level, disabling the PMOS transistor P1, but the potential level at the node C is maintained because the PMOS transistor P2 is enabled. When the first to third decode signals Xa, Xb, and Xc all having high levels are respectively input to the NMOS transistors N1$a$–N1$c$ from the row predecoder 24, the NMOS transistors N1$a$–N1$c$ are all enabled, setting the potential level at the node C to a low level. Even if the PMOS transistor P2 is enabled at this time by setting the current driving performance of the PMOS transistor P2 smaller than those of the NMOS transistors N1$a$–N1$c$, the potential level at the node C is changed to the low level.

As a result, the output of the CMOS inverter P3, N2 becomes a high level so that the normal main word line 50-1 is selected. When the normal main word line 50-1 becomes a high level, the PMOS transistor P2 is disabled so that the potential level at the node C will not be affected at all.

(When the word line 50-1 is not selected)

When one of the first to third decode signals Xa, Xb, and Xc has a low level, one of the NMOS transistors N1$a$–N1$c$ becomes disabled, allowing the potential level at the node C to be kept at $V_{BOOT}$ (high level). Consequently, the output of the CMOS inverter P3, N2 becomes a low level so that the normal main word line 50-1 is not selected. At this time, the PMOS transistor P2 is enabled, causing the potential level at the node C to be kept at $V_{BOOT}$.

(When the word line 50-1 is replaced with the redundant word line)

A description will now be given of the case where after the normal main word line 50-1 is temporarily selected, it is then determined that this word line should be replaced with the redundant main word line 80. When all of the first to third decode signals Xa, Xb, and Xc have high levels, as mentioned above, the potential level at the node C becomes a low level, causing the normal main word line 50-1 to temporarily become a high level.

If any memory cell belonging to the normal main word line 50-1 is defective and the decision output becomes a high level thereafter, the outputs of the AND gates 28 and 30 both become low levels, disabling all of the NMOS transistors N1a–N1c. Once the node C discharges, the conventional normal row decoder cannot set the potential level at the node C back to a high level. According to this embodiment, however, the provision of the AND gate 28 allows the precharge signal PX3 to be enabled based on the decision output. As a result, the PMOS transistor P1 is enabled again, causing the potential level at the node C to become a high level. The normal main word line 50-1 that has temporarily become a high level goes to a low level and becomes unselected.

Figure 3:
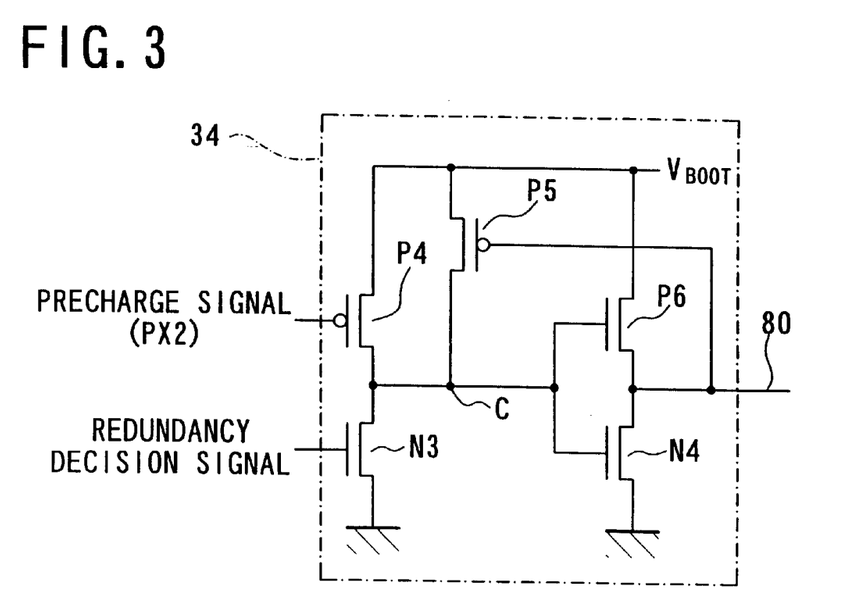
FIG. 3 is a circuit diagram showing the specific structure of a redundant row decoder in FIG. 1.

FIG. 3 shows the specific structure of the redundant row decoder 34. Referring to this diagram, the redundant row decoder 34 comprises PMOS transistors P4, P5, and P6 and NMOS transistors N3 and N4. While the redundant row decoder 34 and the normal row decoder 32-1 basically have the same structure, the output signal (PX2) ot the precharge signal generator 20 is directly input to the gate of the first stage of PMOS transistor P4 and the decision output of the redundancy decision circuit 22 is input to the gate of the first stage of NMOS transistor N3 in the redundant row decoder 34. The node between the drains of the PMOS transistor P6 and the NMOS transistor N4, which constitute a CMOS inverter, is connected to the redundant main word line 80.

The operation of the semiconductor memory device with the above-described structure according to the first embodiment of this invention will now be discussed referring to the timing chart shown in FIG. 4.

(Reading from Normal Word Line)

Figure 4:
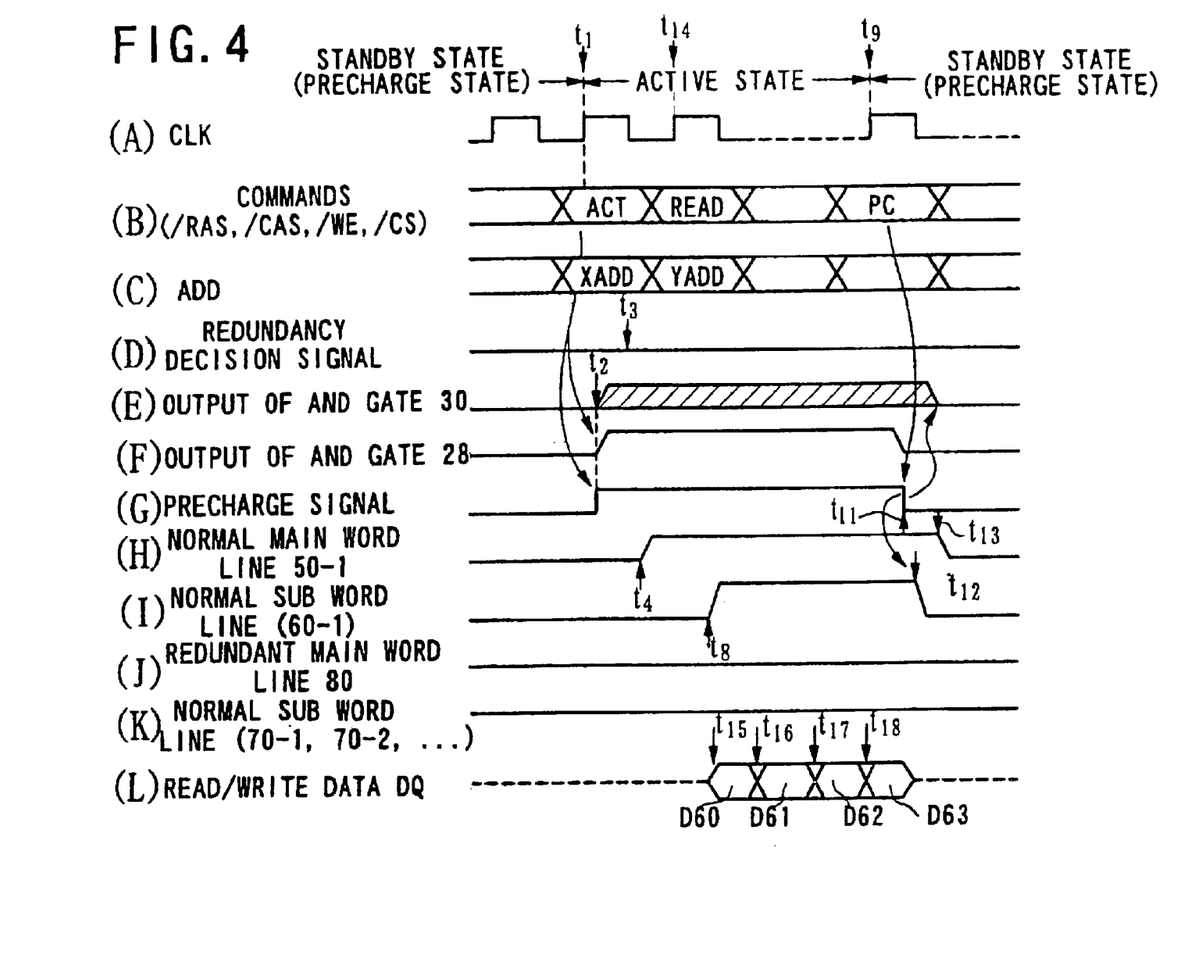
FIG. 4 is a timing chart for explaining the operation of the semiconductor memory device shown in FIG. 1.

Referring to FIG. 4, a description will be given of the reading operation when a normal main word line is selected without being replaced with the redundant word line. In the above structure, each word line is at a precharge state before time t1. That is, all the normal row decoders 32-1 to 32-i and the redundant row decoder 34 are not selected and the individual word lines are precharged to the ground potential (GND).

When the reference clock CLK is input to the internal clock generator 10 at time t1 ((A) in FIG. 4), the active command (ACT) is input to the command decoder 12 and the row address (XADD) is input to the internal address generator 14 in synchronism with the reference clock CLK. As a result, the command decoder 12 sends the active command (ACT) to the row-system controf signal generator 18 ((B) in FIG. 4).

At the same time, the row address (XADD) in the address data is input to the internal address generator 14 which in turn sends the row address data (x0–X2) to the row predecoder 36 and the redundancy decision circuit 22 and the row address data (x3–X11) to the row predecoder 24 and the redundancy decision circuit 22 based on the internal clock ICLK output from the internal clock generator 10 ((C) in FIG. 4).

Based on the control signal output from the row-system control signal generator 18, the precharge signal (PX2) output from the row-system control signal generator 18 becomes a high level at time t2. This precharge signal is sent as PX3 to the normal row decoders 32-1 to 32-i and is sent directly to the redundant row decoder 34, thereby terminating the precharging ((F) and (G) in FIG. 4). At the same time, the row predecoder 24 sends the results (X predecode signals) of decoding the row address data (X3–X11) to the normal row decoders 32-1 to 32-i via the AND gate 30 ((E) in FIG. 4). Further, the row predecoder 36 sends the results of decoding the row address data (X0–X2) to the sub word drivers 38-1, 38-2, . . . , 40-1, 40-2, . . . , and 42-1, 42-2, . At this point of time, one of the normal main word lines 50-1 to 50-1, which are connected to the output nodes of the normal row decoders 32-1 to 32-i is selected and changed to the active state from the standby state (precharge state).

Assuming that the normal row decoder 32-1 is selected by the X predecode signals, as apparent from FIG. 2, the precharge signal (high level) is input to the gate of the PMOS transistor P1 and the first to third predecode signals (high level) are input to the gates of the NMOS transistors N1a–N1c. This turns off the PMOS transistor P1 and turns on the NMOS transistors N1a–N1c, rendering the potential level at the node C to a low level, so that the normal main word line 50-1 connected to the output node of the normal row decoder 32-1 is charged to the boosted voltage $V_{BOOT}$ at time t4 ((H) in FIG. 4).

If it is determined based on the row address data (XADD) input from the redundancy decision circuit 22 that the normal main word line need not be replaced with the redundant main line, the redundancy decision signal to be sent to the redundant row decoder 34 and the AND gates 28 and 30 does not change at time t3 ((D) in FIG. 4). Because, as apparent from FIG. 3, the precharge signal (high level) is input to the gate of the PMOS transistor P4 and the redundancy decision signal (low level) is input to the gate of the NMOS transistor N3 in the redundant row decoder 34, the redundant main word line 80 connected to the output node of the redundant row decoder 34 stays a low level ((J) in FIG. 4).

After the normal main word line 50-1 is selected at time t8, one of the normal sub word lines (e.g., 60-1) is selected based on the decoding results from the row predecoder 36. Consequently, the normal sub word line 60-1 is charged to the boosted voltage $V_{BOOT}$ which is supplied to the gates of the associated memory cells.

At time t14, the read command (READ) and column address (YADD) are input to the command decoder 12 and the internal address generator 14 ((B) and (C) in FIG. 4).

The internal address generator 14 sends the column address (YADD) to the columnsystem control signal generator 16, and at time t15, one of the unillustrated bit lines is selected, and stored data D60 is sent out via the I/O circuit 26 ((L) in FIG. 4).

Suppose that the burst length for consecutive reading has been set to 4 bytes at the phase of the initial setting of the semiconductor memory device according to this embodiment. When the next internal clock ICLK rises, the internal address generator 14 generates the next column address automatically (without being input externally) in synchronism with the rising, and sends the row address to the column-system control signal generator 16. As a result, stored data D61 is output via the I/O circuit 26 at time t16 ((L) in FIG. 4). Thereafter, the above-described operation is repeated to output stored data D62 and D63.

Thereafter, at time t9, the precharge command (PC) is input to the command decoder 12 ((B) in FIG. 4), and the command decoder 12 sends out the precharge command ((A), (B) and (C) in FIG. 4).

When the precharge signal (PX2) falls to a low level from the high level at time t11 in accordance with the output precharge command, all of the first to third decode signals Xa, Xb, and Xc, i.e., the output of the AND gate 30, become low levels ((E) in FIG. 4). The normal sub word line 60-1 discharges at time t12 so that its potential is changed to a low level from the high level ((G) and (I) in FIG. 4). In accordance with the level transition of the precharge signal (PX2) to the low level from the high level at time t11, the normal main word line 50-1 discharges at time t13 so that its potential becomes a low level ((H) in FIG. 4).

According to this embodiment, the precharge signal output via the AND gate 28 is equivalent to the first control signal in this invention and the precharge signal that is sent directly to the redundant row decoder 34 from the precharge signal generator 20 is equivalent to the second control signal in this invention.

Figure 5:
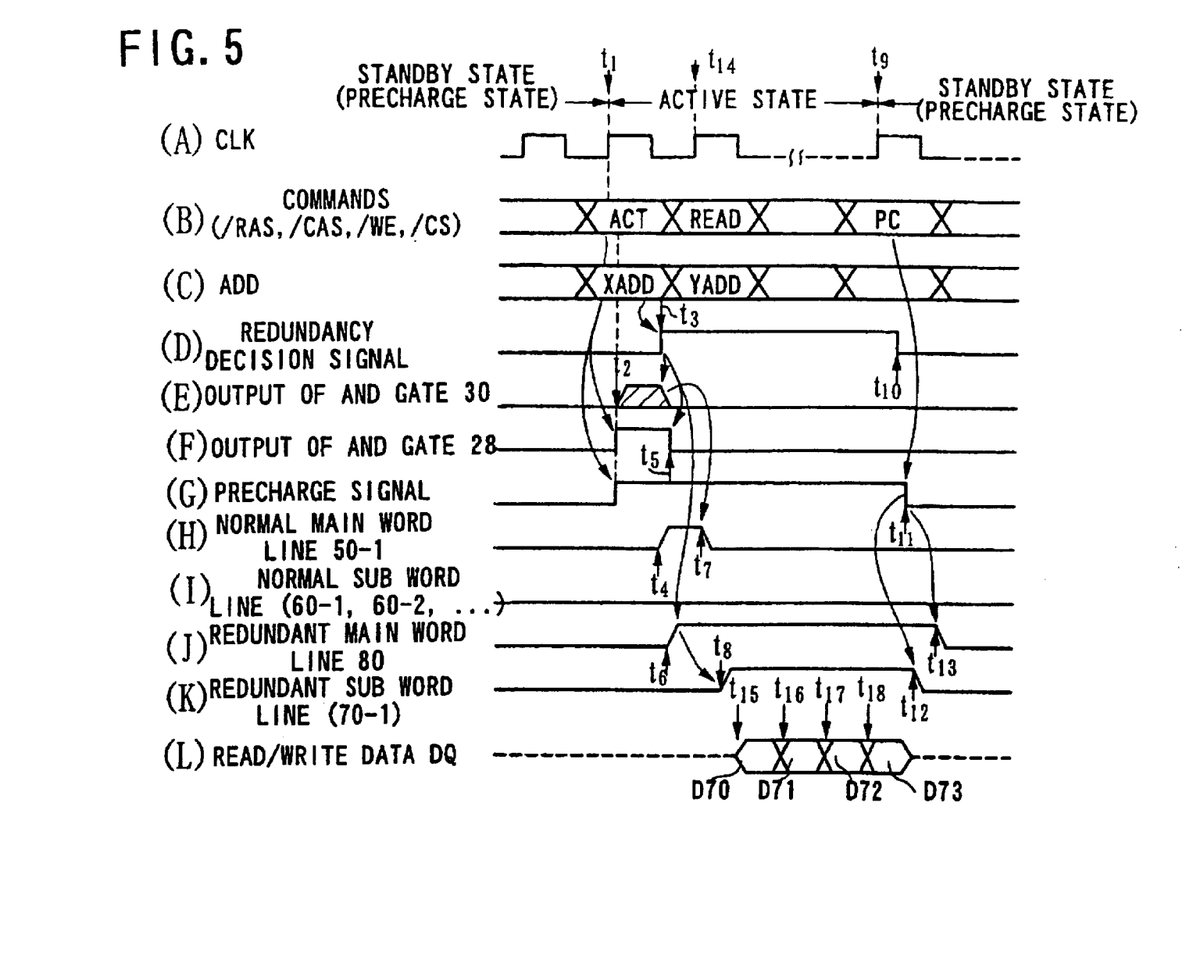
FIG. 5 is a timing chart for explaining the operation of the semiconductor memory device shown in FIG. 1.

(Reading from Redundant Word Line)

Referring to FIG. 5, a description will be given of the reading operation when a normal main word line is replaced with the redundant word line. In the above structure, each word line is at a precharge state before time t1. That is, none of the normal row decoders 32-1 to 32-i and the redundant row decoder 34 are selected and the individual word lines are precharged to the ground potential (GND). When the reference clock CLK is input to the internal clock generator 10 at time t1 ((A) in FIG. 5), the command decoder 12 sends the active command (ACT) to the row-system control signal generator 18 ((B) in FIG. 5).

At the same time, the row address (XADD) in the address data is input to the internal address generator 14 which in turn sends the row address data (x0–X2) to the row predecoder 36 and the redundancy decision circuit 22 and the row address data (x3X–X11) to the row predecoder 24 and the redundancy decision circuit 22 based on the internal clock ICLK output from the internal clock generator 10 ((C) in FIG. 5).

Based on the control signal output from the row-system control signal generator 18, the precharge signal (PX2) output from the row-system control signal generator 18 is sent as PX3 to the normal row decoders 32-1 to 32-i and is sent directly to the redundant row decoder 34 ((F) and (G) in FIG. 5). At the same time, the row predecoder 24 sends the results (X predecode signals Xa, Xb and Xc) of decoding the row address data (X3–X11) to the normal row decoders 32-1 to 32-i via the AND gate 30 ((E) in FIG. 5).

Further, the row predecoder 36 sends the results of decoding the row address data (X0–X2) to the sub word drivers 38-1, 38-2, ..., 40-1, 40-2, ..., and 42-1, 42-2, ....

At this point of time, one of the normal main word lines 50-1 to 50-1 which are connected to the output nodes of the normal row decoders 32-1 to 32-i is selected and changed to the active state from the standby state (precharge state).

Assuming that the normal row decoder 32-1 is selected by the X predecode signals or the output of the AND gate 30, as apparent from FIG. 2, the precharge signal (high level) is input to the gate of the PMOS transistor P1 and the first to third predecode signals (high level) are input to the gates of the NMOS transistors N1a–N1c. This turns off the PMOS transistor P1 and turns on the NMOS transistors N1a–N1c, rendering the potential level at the node C to a low level, so that the normal main word line 50-1 connected to the output node of the normal row decoder 32-1 is charged to the boosted voltage $V_{BOOT}$ at time t4 ((H) in FIG. 5).

If it is determined based on the row address data input from the redundancy decision circuit 22 that the accessed memory cell is defective and thus that a memory cell belonging to the redundant row should be selected, the redundancy decision signal is sent to the redundant row decoder 34 and the AND gates 28 and 30 at time t3 ((D) in FIG. 5). Because, as apparent from FIG. 3, the precharge signal (high level) is input to the gate of the PMOS transistor P4 and the redundancy decision signal (high level) is input to the gate of the NMOS transistor N3 in the redundant row decoder 34, the redundant main word line 80 connected to the output node of the redundant row decoder 34 is charged to the boosted voltage $V_{BOOT}$ at time t6 ((J) in FIG. 5).

As the redundancy decision signal (high level) is input to the AND gates 28 and 30, the precharge signal PX3 supplied to the normal row decoder 32 falls at time t5 in accordance with the rising of the redundancy decision signal. At the same time, the X predecode signals Xa, Xb, and Xc output from the AND gate 30 also fall ((F) and (E) in FIG. 5).

As a result, the normal main word line 50-1 that has almost been selected discharges at time t7 so that its potential falls to a low level. Therefore, the sub word lines 60-1, 60-2, ... obtained by separating the normal main word line 50-1 are not charged ((I) in FIG. 4). In this manner, the normal main word line 50-i that has been enabled once can be disabled again before the next precharge command (PC) is input during one active command (ACT) cycle.

After the redundant main word line 80 is selected at time t8, one of the redundant sub word lines (e.g., 70-1) is selected. Accordingly, the redundant sub word line 70-1 is charged to the boosted voltage $V_{BOOT}$ which is supplied to the gates of the associated memory cells.

At time t14, the read command (READ) and column address (YADD) are input to the command decoder 12 and the internal address generator 14 ((B) and (C) in FIG. 5).

The internal address generator 14 sends the column address (YADD) to the column-system control signal generator 16, and at time t15, one of the unillustrated bit lines is selected and stored data D70 in the associated memory cell connected to the redundant sub word line 70-1 is sent out via the I/O circuit 26 ((L) in FIG. 5).

When the next internal clock ICLK rises, the internal address generator 14 generates the next column address automatically (without being input externally) in synchronism with the rising, and sends the row address to the column-system control signal generator 16. As a result, stored data D71 is output via the I/O circuit 26 at time t16 ((L) in FIG. 5). Thereafter, the above-described operation is repeated to output stored data D72 and D73.

When the precharge command (PC) is input to the command decoder 12 ((B) in FIG. 5) in synchronism with the reference clock CLK ((A) in FIG. 5) and the command decoder 12 sends out the precharge command at time t9, the precharge signal (PX2) becomes a low level ((C) in FIG. 5) and the redundancy decision signal falls to a low level from the high level at time t10 ((D) in FIG. 5).

When the precharge signal (PX2) falls to the low level from the high level at time t11 in accordance with the output precharge command ((G) in FIG. 5), the redundant row decoder 34 is precharged so that the redundant sub word line 70-1 discharges at time t12 and its potential is changed to a low level from the high level ((K) in FIG. 5). In accordance with the level transition of the precharge signal (PX2) to the low level from the high level at time t11, the redundant main word line 80 discharges at time t13 so that its potential becomes a low level ((J) in FIG. 5).

According to this embodiment, the precharge signal output via the AND gate 28 is equivalent to the first control signal in this invention and the precharge signal that is sent directly to the redundant row decoder 34 from the precharge signal generator 20 is equivalent to the second control signal in this invention.

Although the reading operation has been discussed in the foregoing description, the writing operation is carried out in a similar manner as the write command and write data are supplied.

According to the semiconductor memory device of the first embodiment of this invention, when the redundancy decision circuit 22 has determined to select a memory cell belonging to the redundant row at the time the word lines connected to the normal row decoders have been changed from the standby state to the active state, the precharge signal generator 20 and the AND gate 28 that constitute the control means change only those word lines which are connected to the normal row decoders from the active state to the standby state based on the decision output of the redundancy decision circuit 22.

This can permit a target normal row decoder to be selected without waiting for the decision being made on whether or not to select a memory cell belonging to the redundant row. It is therefore possible to select quickly the word line that is connected to the target normal row decoder.

Figure 6:
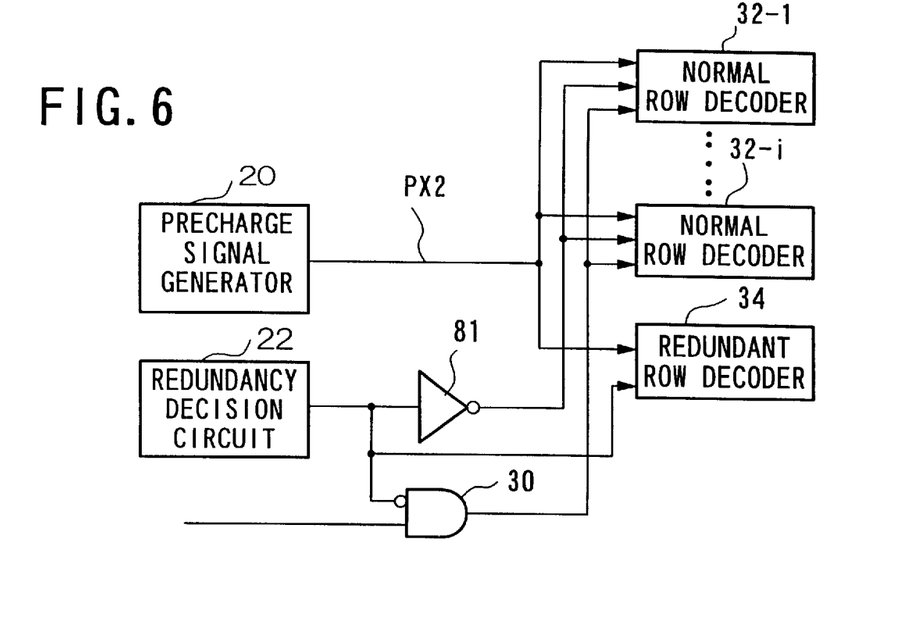
FIG. 6 is a block diagram illustrating the structure of the essential portion of a semiconductor memory device according to a second embodiment of this invention.

FIG. 6 illustrates the structure of the essential portion of a semiconductor memory device according to the second embodiment of this invention. The semiconductor memory device according to this embodiment structurally differs from the semiconductor memory device of the first embodiment in that the AND gate 28 is omitted and an inverter 81, which inverts the redundancy decision signal output from the redundancy decision circuit 22 when a memory cell belonging to the redundant row is selected, is added as apparent from FIG. 6, and a PMOS transistor P8 is added in each of the normal row decoders 32-1 to 32-i as apparent from FIG. 7, so that the precharge signal supplied within the normal row decoder is changed to a low level from a high level by the inverted redundancy decision signal acquired via the inverter 81. As the other parts of the structure are the same as those of the first embodiment, their explanation will not be repeated. The precharge signal generator 20 and the inverter 81 are equivalent to the third control means of this invention.

Figure 7:
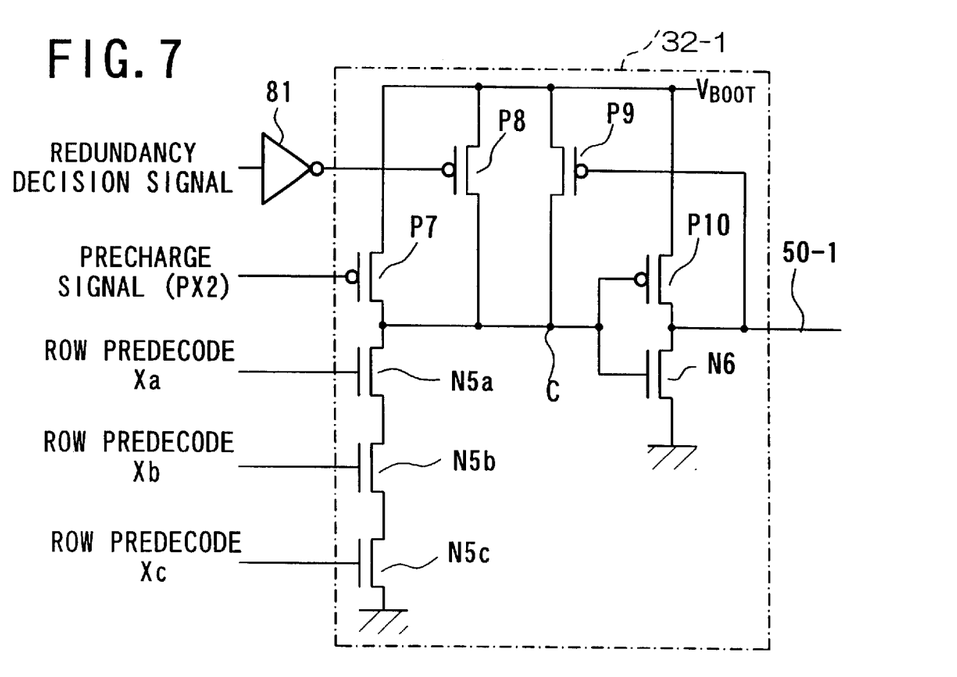
FIG. 7 is a circuit diagram showing the specific structure of a normal row decoder in FIG. 6.

FIG. 7 shows the specific structure of each normal row decoder. Because a plurality of normal row decoders 32-1 to 32-i have the same structure, only the normal row decoder 32-1 will be discussed below. Referring to FIG. 7, the normal row decoder 32-1 comprises PMOS transistors P7, P8, P9, and P10 and NMOS transistors N5a to N5c and N6.

The structure of the normal row decoder 32-1 in this embodiment differs from that shown in FIG. 1 in the additional provision of the PMOS transistor P8 whose drain is connected to the node between the drain of the first stage of PMOS transistor P7 (equivalent to the PMOS transistor P1 in FIG. 1) and the drain of the NMOS transistor N5 (equivalent to the NMOS transistor N1 in FIG. 1), whose source is connected to the boosting voltage Supply $V_{BOOT}$ and whose gate is supplied with the inverted signal of the redundancy decision signal.

When the redundancy decision signal output from the redundancy decision circuit 22 is changed to a high level from the low level in the above structure, the redundancy decision signal is inverted by the inverter 81. As a result, the PMOS transistor P8 in the normal row decoder 32-1 is turned on, thus precharging the node C to the potential $V_{BOOT}$. This causes the normnal main word line 50-1 connected to the output node of the normal row decoder 32-1 to discharge and become a low level. According to this embodiment, the precharge signal output from the precharge signal generator 20 is equivalent to the third control signal in this invention and the output of the inverter 81, which is the inverted version of the decision output of the redundancy decision circuit 22, is equivalent to the fourth control signal in this invention.

Even if the node C, which has been precharged to the potential $V_{BOOT}$ by the precharge signal PX2, discharges as a result of all the row predecode signals Xa, Xb, and Xc becoming high levels, the PMOS transistor P8 which operates based on the redundancy decision signal can precharges the node C again.

The semiconductor memory device according to the second embodiment has the same advantages as the semiconductor memory device according to the first embodiment.

As apparent from the above description, this invention can achieve fast reading and writing of a semiconductor memory device.

In addition, this invention allows semiconductor memory devices to be designed without considering the operation speeds of the row decoder and redundancy decision circuit. Further, because unlike the prior art, this invention does not require a delay circuit inserted in the row decoder, the row decoding process can be executed at a high speed and the chip area can be reduced accordingly. Furthermore, there is no inadequate delay time which would otherwise be caused by a manufacture-oriented variation, thus leading to an improved yield.

What is claimed is:

1. A semiconductor memory device controlling a precharge for a redundant word line, comprising:

a node to be precharged to a predetermined level;

normal row decoding means for discharging said node when predetermined address data is input, said predetermined address input data indicating that one of a normal word line is selected; and precharge means for precharging said node again when said predetermined address input data indicates that one of the redundant word lines is selected.

2. The semiconductor memory device according to claim 4, wherein said precharge means has one precharge transistor which is enabled to set said node to a precharge potential when a precharge command is externally input or one of said redundant word lines is selected.

3. The semiconductor memory device according to claim 5, wherein said precharge means has first and second precharge transistor transistors such that said first precharge transistor is enabled to set said node to said precharge potential when said precharge command is externally input and said second precharge transistor is enabled to set said node to said precharge potential when one of said redundant word lines is selected.

4. A semiconductor memory device controlling a precharge for a redundant word line, comprising:

a node to be precharged to a predetermined level;

a normal row decoder for discharging said node when predetermined address data is input, wherein said predetermined address input data indicates that one of a normal word line is selected rather than said redundant word line; and a switch for one of either precharging said node again and maintaining a pre-existing precharge on said node when said redundant word line is selected.

* * * * *